United States Patent
Watanabe et al.

(10) Patent No.: US 10,783,220 B2
(45) Date of Patent: *Sep. 22, 2020

(54) DATA PROCESSING METHOD, DATA PROCESSING APPARATUS AND PROCESSING APPARATUS

(71) Applicant: HITACHI HIGH-TECHNOLOGIES CORPORATION, Tokyo (JP)

(72) Inventors: Seiichi Watanabe, Tokyo (JP); Satomi Inoue, Tokyo (JP); Shigeru Nakamoto, Tokyo (JP); Kousuke Fukuchi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/053,158

(22) Filed: Aug. 2, 2018

(65) Prior Publication Data

US 2018/0341625 A1    Nov. 29, 2018

Related U.S. Application Data

(63) Continuation of application No. 14/447,692, filed on Jul. 31, 2014, now Pat. No. 10,073,818.

(30) Foreign Application Priority Data

Nov. 29, 2013 (JP) ................. 2013-246891
May 30, 2014 (JP) ................. 2014-111875

(51) Int. Cl.
  *G06F 17/18* (2006.01)
  *H01J 37/32* (2006.01)
  *H01L 21/66* (2006.01)

(52) U.S. Cl.
  CPC ........ *G06F 17/18* (2013.01); *H01J 37/32963* (2013.01); *H01L 22/26* (2013.01)

(58) Field of Classification Search
  CPC ..... G06F 17/18; H01L 22/26; H01J 37/32963
  See application file for complete search history.

(56) References Cited

U.S. PATENT DOCUMENTS 6,197,116 B1 * 3/2001 Kosugi .............. C23C 16/50
                                                    118/712
6,596,551 B1   7/2003 Usui et al.
(Continued)

FOREIGN PATENT DOCUMENTS

JP     61-53728 A     3/1986
JP     2000-228397 A  8/2000
(Continued)

OTHER PUBLICATIONS

E. E. Adam, W. L. Berry and D. C. Whybark, "An experimental comparison of exponential and adaptive smoothing forecasting models using actual operating data", Computers and Industrial Engineering, vol. 2, pp. 91-98, 1978 (Year: 1978).*
(Continued)

*Primary Examiner* — Matthew D Sandifer
(74) *Attorney, Agent, or Firm* — Baker Botts L.L.P.

(57) ABSTRACT

The present invention is a data processing apparatus including a data input/output device for receiving data, a storage for storing the data received by the data input/output device, a data processing program storage for storing a data processing program that includes the steps of calculating, using a double exponential smoothing method, a first predicted value that is a predicted value of smoothed data and a second predicted value that is a predicted value of the gradient of the smoothed data, and calculating, using a double exponential smoothing method in which the second predicted value is set as input data, a third predicted value that is a predicted value of smoothed data and a fourth predicted value that is a predicted value of the gradient of the smoothed data, and a (Continued)

data calculation processing apparatus for performing the data processing under the data processing program.

8 Claims, 12 Drawing Sheets

(56) References Cited

U.S. PATENT DOCUMENTS

| | | |
|---|---|---|
| 6,782,297 B2 | 8/2004 | Tabor |
| 7,020,791 B1 | 3/2006 | Aweya et al. |
| 7,297,560 B2 | 11/2007 | Yue |
| 8,747,608 B2 | 6/2014 | Usui et al. |
| 2002/0009814 A1 | 1/2002 | Usui et al. |
| 2002/0183868 A1 | 12/2002 | Tabor |
| 2003/0043383 A1 | 3/2003 | Usui et al. |
| 2016/0336154 A1 | 11/2016 | Watanabe et al. |

FOREIGN PATENT DOCUMENTS

| | | |
|---|---|---|
| JP | 2004-110300 A | 4/2004 |
| JP | 2006-505138 A | 2/2006 |
| JP | 2007-234859 A | 9/2007 |
| KR | 10-2000-0047790 A | 7/2000 |
| KR | 10-2004-0016868 A | 2/2004 |

OTHER PUBLICATIONS

T. M. Williams, "Adaptive Holt-Winters Forecasting", J. Opl Res. Soc., vol. 38, No. 6, pp. 553-560, 1987 (Year: 1987).*

E. S. Gardner, "Exponential smoothing: The state of the art—Part II", Int. J. Forecast., vol. 22, pp. 637-666, 2006 (Year: 2006).*

Min Gyo Chung et al., "Efficient jitter compensation using double exponential smoothing," Information Sciences, Dec. 11, 2012, vol. 227, pp. 83-89.

Editorial department of IT information management, "Exponential smoothing", Information management glossary, [online], Aug. 24, 2004, ITmedia, Inc., [searched on Jul. 3, 2018], Internet, <URL: http://itmedia.co.jp/im/articles/0408/24/news092.html> (English translation attached).

Notification of Reasons for Refusal, dated Jul. 10, 2018, which issued during the prosecution of Japanese Patent Application No. 2017-207735, which corresponds to the present application (English translation attached).

K. Takahashi, "Inside Data Processing," Journal of Surface Analysis vol. 7, No. 1, 2000, p. 68-77 (English translation attached).

A. C. Harvey, "Time Series Models," translated by N. Kunimoto & T. Yamamoto, University of Tokyo Press, 1985, p. 173 (English translation attached).

K. Kuwahara and T. Kawamura, "Fluid Calculation and Finite Difference Method," Asakura Publishing, 2005, p. 1 (English translation attached).

Office Action, dated Aug. 19, 2015, which issued during the prosecution of Korean Patent Application No. 2014-97409, which corresponds to the present application (partial English translation attached).

F Guerin, S. G. Fabri, M. K. Bugeja, "Double exponential smoothing for predictive vision based target tracking of a wheeled mobile robot", Proc. 52nd Annual Conference on Decision and Control (CDC), pp. 3535-3540, Dec. 2013.

S. Butler, J. Stefani, "Supervisory run-to-run control of polysilicon gate etch using in situ ellipsometry", IEEE Trans. Semiconductor Manufact., vol. 7, pp. 193-201, May 1994.

Office Action, dated Sep. 25, 2018, which issued during the prosecution of Japanese Patent Application No. 2015-097000, which corresponds to the present application (English translation attached).

\* cited by examiner

PRIOR ART
FIG. 5
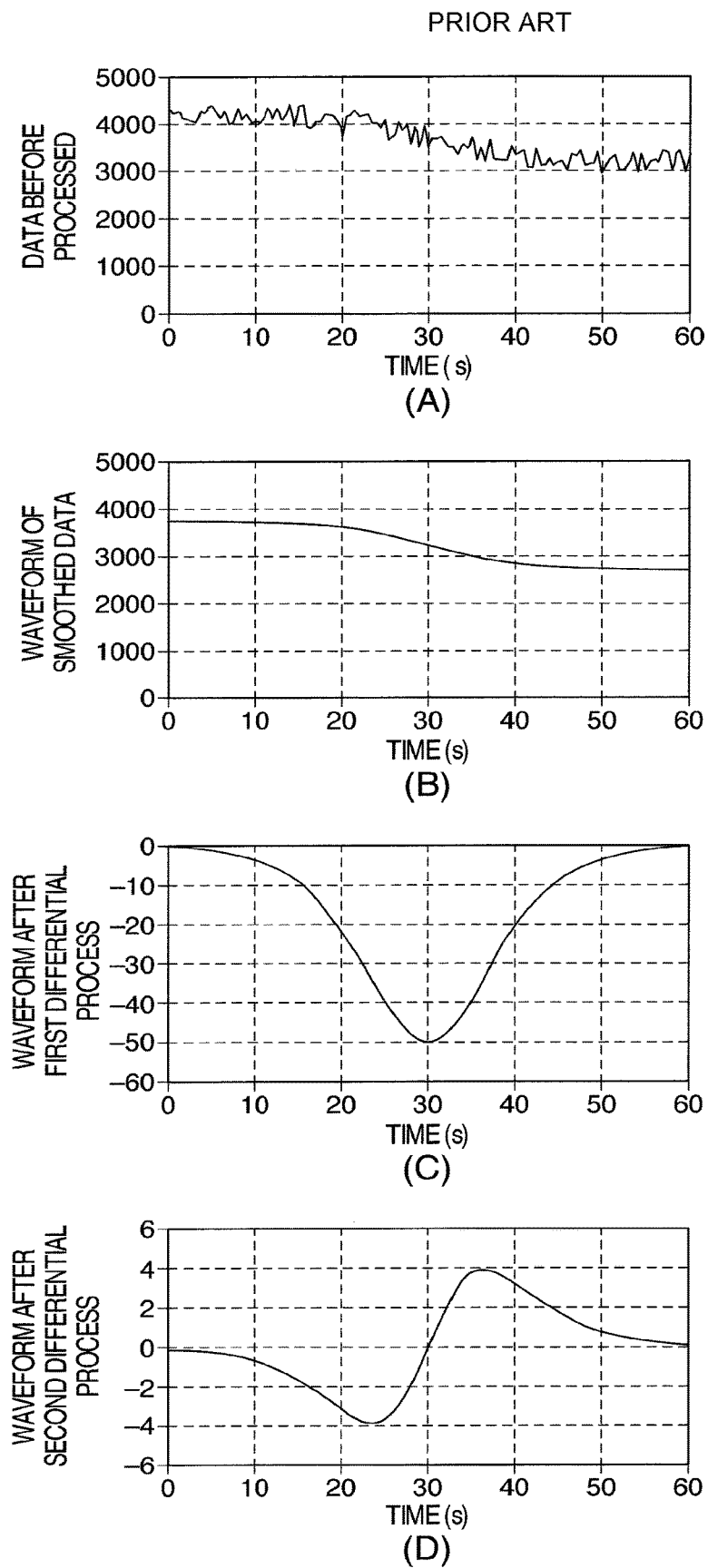
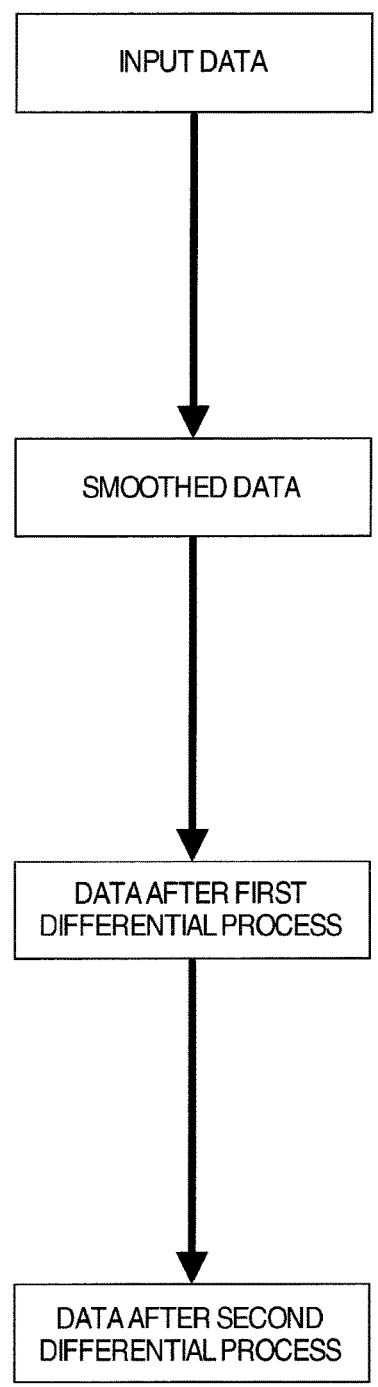

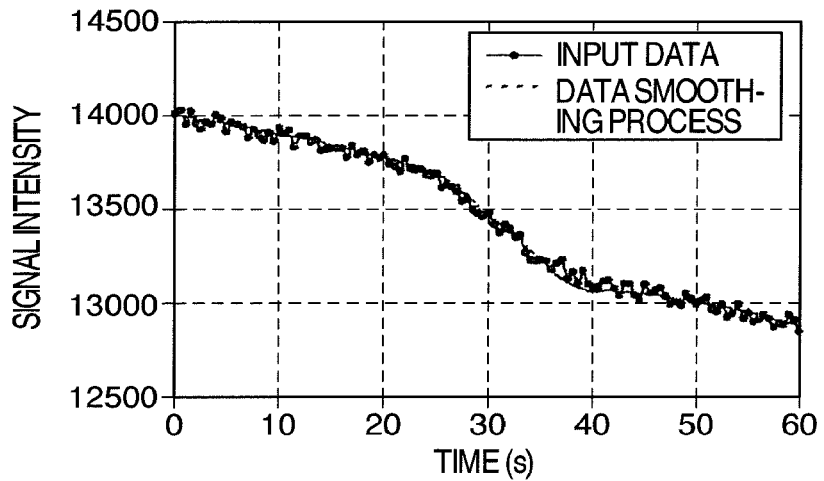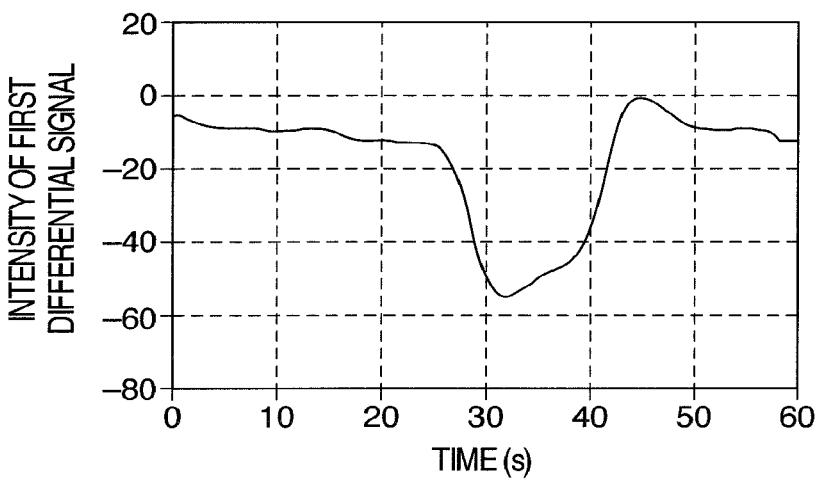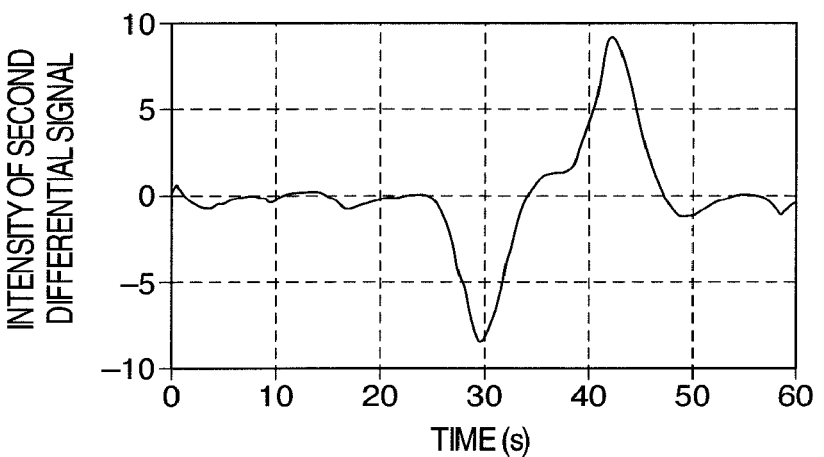

DATA PROCESSING METHOD, DATA PROCESSING APPARATUS AND PROCESSING APPARATUS

CROSS REFERENCE TO PRIOR APPLICATIONS

This application is a continuation of U.S. patent application Ser. No. 14/447,692, filed on Jul. 31, 2014, which claims benefit of priority to Japanese Application No. 2014-111875, filed on May 30, 2014 and Japanese Application No. 2013-246891, filed on Nov. 29, 2013. The contents of the above applications are hereby incorporated by reference.

BACKGROUND OF THE INVENTION

The present invention relates to a data processing method and a data processing apparatus for processing a series of numerical data on a target system (device, analyzed data, or the like).

Various models have been proposed as techniques for smoothing or predicting a series of numerical data on a target system. In addition, aiming at grasping the state of a target system, differential processes such as first differential and second differential of data are frequently used so as to detect an extreme value (maximum value or minimum value) or an inflection point, which is a changing point in the data. In particular, in the case of time series data such as measured data containing noise and the like, a technical issue is to perform a data smoothing process and a differential process with high precision to detect a changing point in a target system, and to control the target system.

Conventional techniques to perform data smoothing and data prediction include a curve fitting method, a moving average method, and the like, as described in K. Takahashi, "Inside Data Processing", Journal of Surface Analysis Vol. 7, No. 1, 2000, p. 68-p. 77. The curve fitting method includes a polynomial curve-fitting method (Savitzky-Golay method), as described in JP-A-2000-228397, and in addition, a digital filter includes a Butterworth low-pass filter. Furthermore, the moving average method includes an exponential smoothing method, and the like, as described in A. C. Harvey, "TIME SERIES MODELS", translated by N. Kunitomo & T. Yamamoto, University of Tokyo Press, 1985, p. 173. Although "TIME SERIES MODELS" discloses a single exponential smoothing method (with one smoothing parameter), a double exponential smoothing method (with two smoothing parameters) is also used in economics-related fields such as supply and demand estimation.

For conventional techniques to perform a data differential process, a finite difference method is frequently used, as described in "Fluid Calculation and Finite Difference Method" written and edited by K. Kuwahara & T. Kawamura, Asakura Publishing, 2005, p. 1. In addition, it is the case that a polynomial curve-fitting method (Savitzky-Golay method) is used therefor, as described in JP-A-2000-228397. Furthermore, as an example in which time series data such as measured data containing noise and the like is subjected to a data smoothing process, a changing point of data is detected through a first differential process and a second differential process, and a target system is controlled, JP-A-61-53728 discloses a method in a plasma etching processing apparatus that includes subjecting spectral intensity signal data based on plasma emission to a data smoothing process by a moving average process and determining the end point of etching process with a first differential value and a second differential value.

As described in JP-A-2000-228397, when the data differential process is performed by the finite difference method and if the data smoothing process is not sufficient, the output result of the first differential process contains much noise, resulting in data being not smooth and having a low S/N ratio (ratio of signal/noise). When the data differential process is performed again by the finite difference method using the above data, the output result of the second differential process contains still more noise, resulting in data being not smooth and having a further low S/N ratio, which is problematic.

When difference intervals are increased, the output result of the first differential process and the output result of the second differential process are obtained as smooth data and have an increased S/N ratio (note that there is an optimal value for the difference interval), but in the case of the time series data, in particular, there is a problem that the amount of data delay caused by the data differential process increases. In addition, in a low-pass filter, or the like, when a cut-off frequency is decreased, the output data of the first differential process and the output data of the second differential process are obtained as smooth data and have an increased S/N ratio (note that there is an optimal value for the cut-off frequency), but as with the above, there is a problem in that the amount of data delay caused by the data differential process increases.

Furthermore, in the case where the data differential process is performed using a polynomial curve-fitting method (Savitzky-Golay method), a plurality of pieces of data are generally needed and a differential value is derived at a point in time of the middle piece of the data. For this reason, there is a problem with the sequential data processing that a time delay occurs in principal by at least a time difference between a point in time of the latest piece of the data and the point in time of the middle piece of the data.

Furthermore, in the data smoothing process, errors tend to develop in general during a certain period of time immediately after the start of the data processing. For example, in the case of the time series data, the data period is short and a sampling time interval is long, and thus if the number of pieces of the data is small, a ratio of the period during which the error is large with respect to the whole data period is large. In addition, there is a problem that performing the data differential process in the period during which the error is large has little reliability.

Furthermore, there is a method disclosed in JP-A-61-53728 as an end point determining method in the plasma etching in the plasma etching processing apparatus, but the end point determining method in the plasma etching disclosed in JP-A-61-53728 involves the following two problems.

Current semiconductor devices each have a high-step structure such as a Fin Field Effect Transistor (Fin FET) structure due to higher performance and integration. In addition, in normal plasma etching, microloading occurs, which is the difference in etching performance between sparse patterns and dense patterns. Furthermore, a thickness of film to be etched is not uniform across the surface of a wafer.

For these reasons, for example, there is the case where time series data on spectral intensity signal data based on plasma emission used for determining the end point of plasma etching changes in two stages. Hence, in the case where the time series data on the spectral intensity signal data based on the plasma emission changes in two stages, and the end point of the plasma etching is determined at the second change, data processing cannot track the second change and the end point of the plasma etching cannot be detected because the first change and the second change occur in a short time. Note that, here, a point in time at which the time series data on the spectral intensity signal data based on the plasma emission changes is defined as the end point of the plasma etching.

Furthermore, for example, in a plasma etching the period of which is short with respect to retardation times of a first differential value and a second differential value, in case where the end point of plasma etching is determined by the change of the time series data on the spectral intensity signal data based on the plasma emission, data processing to calculate the first differential value or the second differential value cannot track a change, to be the end point of plasma etching, in time series data on spectral intensity signal data based on plasma emission. That is, the responsiveness of detecting the end point of plasma etching process is insufficient, which is the first problem.

Next, mask patterns for plasma etching are roughly divided into groove patterns and hole patterns. In addition, an aperture ratio of a wafer of a hole pattern is normally less than an aperture ratio of a wafer of a groove pattern, and there is even a case where the aperture ratio is less than 1%. Furthermore, the spectral intensity of plasma emission is reduced as the aperture ratio becomes small. For this reason, for example, in the case of a wafer of an aperture ratio of less than 1%, it is difficult to detect the end point of plasma etching process since a change in the time series data on the spectral intensity signal data based on the plasma emission is too small. That is, a low S/N ratio cannot be supported, which is the second problem. Note that, here, the aperture ratio is a ratio of an area to be etched to the entire area of the wafer.

For the foregoing reasons, in the case of detecting a changing point in a target system with first differential data or second differential data and controlling the target system, there is a problem that the precision of the control is insufficient due to a low S/N ratio and a time delay, or the like.

SUMMARY OF THE INVENTION

In view of this, the present invention provides a data processing method and a data processing apparatus that achieve both a high S/N ratio and a reduced data delay in a data processing method and a data processing apparatus for processing data.

The present invention is a data processing apparatus including a data input/output device which is configured to receive data to be processed, a storage which is configured to store the data received by the data input/output device, a data processing program storage which is configured to store a data processing program that includes the steps of calculating, using a double exponential smoothing method, a first predicted value that is a predicted value of smoothed data and a second predicted value that is a predicted value of the gradient of the smoothed data, and calculating, using a double exponential smoothing method in which the second predicted value is set as input data, a third predicted value that is a predicted value of smoothed data and a fourth predicted value that is a predicted value of the gradient of the smoothed data, and a data calculation processing apparatus which is configured to perform the data processing under the data processing program, wherein the data input/output device outputs the first predicted value calculated by the data calculation processing apparatus as the result of a data smoothing process, a second predicted value calculated by the data calculation processing apparatus or a third predicted value calculated by the data calculation processing apparatus as the result of a first differential process, and a fourth predicted value calculated by the data calculation processing apparatus as the result of a second differential process, respectively.

The present invention is a processing apparatus including a processing chamber to be a control object, a measuring device which is configured to obtain data relating to the processing chamber, a data calculation processing apparatus which is configured to perform data processing under a data processing program that includes the steps of calculating, using a double exponential smoothing method, a first predicted value that is a predicted value of smoothed data, a second predicted value that is a predicted value of the gradient of the smoothed data, and calculating, using a double exponential smoothing method in which the second predicted value is set as input data, a third predicted value that is a predicted value of smoothed data and a fourth predicted value that is predicted value of the gradient of the smoothed data, and a controller which is configured to detect the state of the processing chamber or a change in the state of the processing chamber on the basis of at least one of the first predicted value calculated by the data calculation processing apparatus, the second predicted value calculated by the data calculation processing apparatus, the third predicted value calculated by the data calculation processing apparatus, and the fourth predicted value calculated by the data calculation processing apparatus, and to control the processing chamber according to the detection result.

The present invention is a processing apparatus including a processing chamber to be a control object, a measuring device which is configured to obtain data relating to the processing chamber, a data calculation processing apparatus which is configured to perform data processing under a data processing program that uses a responsive double exponential smoothing method in which smoothing parameters are varied in accordance with an error between the data obtained by the measuring device and the predicted value of smoothed data, and that processes data while making a lower limit value of the variable range of the smoothing parameters greater than zero, and a controller which is configured to detect the state of the processing chamber or a change in the state of the processing chamber on the basis of at least one of the result of a data smoothing process calculated by the data calculation processing apparatus, the result of a first differential process calculated by the data calculation processing apparatus, and the result of a second differential process calculated by the data calculation processing apparatus, and to control the processing chamber according to the detection result.

The present invention is a processing apparatus including a processing chamber in which a sample mounted on a sample stage is subjected to a plasma process, a measuring device which is configured to obtain light emission data in the plasma process of the sample, a data calculation processing apparatus which is configured to perform data processing under a data processing program that uses a responsive double exponential smoothing method in which smoothing parameters are varied in accordance with an error between the data obtained by the measuring device and the predicted value of smoothed data, and that processes data while making a lower limit value of the variable range of the smoothing parameters greater than zero, a controller which is configured to detect a plasma processing state of the sample or a change in the plasma processing state of the sample on the basis of at least one of the result of data smoothing process calculated by the data calculation processing apparatus, the result of a first differential process calculated by the data calculation processing apparatus, or the result of a second differential process calculated by the data calculation processing apparatus, and to control the processing chamber according to the detection result.

The present invention is a data processing method for processing data using a double exponential smoothing method, including the steps of calculating, using the double exponential smoothing method, a first predicted value that is a predicted value of smoothed data and a second predicted value that is a predicted value of the gradient of smoothed data, and calculating, using a double exponential smoothing method in which the second predicted value is set as input data, a third predicted value that is a predicted value of smoothed data and a fourth predicted value that is a predicted value of the gradient of smoothed data.

The present invention is a data processing method for processing data using a double exponential smoothing method including the steps of calculating an approximate polynomial of an arbitrary number of pieces of data immediately following the start of data input, calculating, using the approximate polynomial, a first predicted value that is a predicted value of smoothed data immediately preceding the start of data input, calculating a second predicted value that is a predicted value of the gradient of the smoothed data immediately preceding the start of data input, and subjecting the data to a double exponential smoothing process as the first predicted value and the second predicted value are set as initial values.

The present invention is a data processing method for processing data using a responsive double exponential smoothing method in which smoothing parameters are varied in accordance with the error between the input data and the predicted value of smoothed data, wherein a lower limit value of the variable range of the smoothing parameters is greater than zero.

The present invention is a data processing method for processing data using an exponential smoothing method, wherein when N denotes a natural number, the exponential smoothing method is an N-tuple exponential smoothing process to perform a data smoothing process on the data and perform the first to (N−1)th smoothing processes to gradient of the data.

The present invention is a plasma processing method for subjecting a sample to a plasma process, including processing, using a responsive double exponential smoothing method in which light emission data in the plasma process of the sample is measured and smoothing parameters are varied in accordance with the error between the measured light emission data and the predicted value of smoothed light emission data, the light emission data while making a lower limit value of the variable range of the smoothing parameters greater than zero, detecting the plasma processing state of the sample or a change in the plasma processing state of the sample on the basis of at least one of the result of a data smoothing process calculated by the responsive double exponential smoothing method, the result of a first differential process calculated by the responsive double exponential smoothing method, and the result of a second differential process calculated by the responsive double exponential smoothing method, and controlling the plasma process of the sample according to the detection result.

According to the present invention, a high S/N ratio and a reduced data delay are both achieved in a data processing method and a data processing apparatus for processing data.

Other objects, features and advantages of the invention will become apparent from the following description of the embodiments of the invention taken in conjunction with the accompanying drawings.

BRIEF DESCRIPTION OF THE DRAWINGS

FIG. 5 is a flowchart of typical data processing of detecting the end point of etching process;
FIGS. 10A-C are graphs showing the data processing results when the exponential parameter N=5 in the data processing apparatus of the second embodiment.

DETAILED DESCRIPTION OF THE EMBODIMENTS

Embodiments of the present invention will be described below with reference to the drawings.

First Embodiment

A data processing apparatus according to a first embodiment of the present invention will be first described with reference to FIG. 1 to FIG. 7. Here, an example will be described in which the present invention is applied to the detection of an end point of etching process using plasma emission spectrography aiming at a high-precision etching process in an electron cyclotron resonance microwave plasma etching system.

Figure 1:
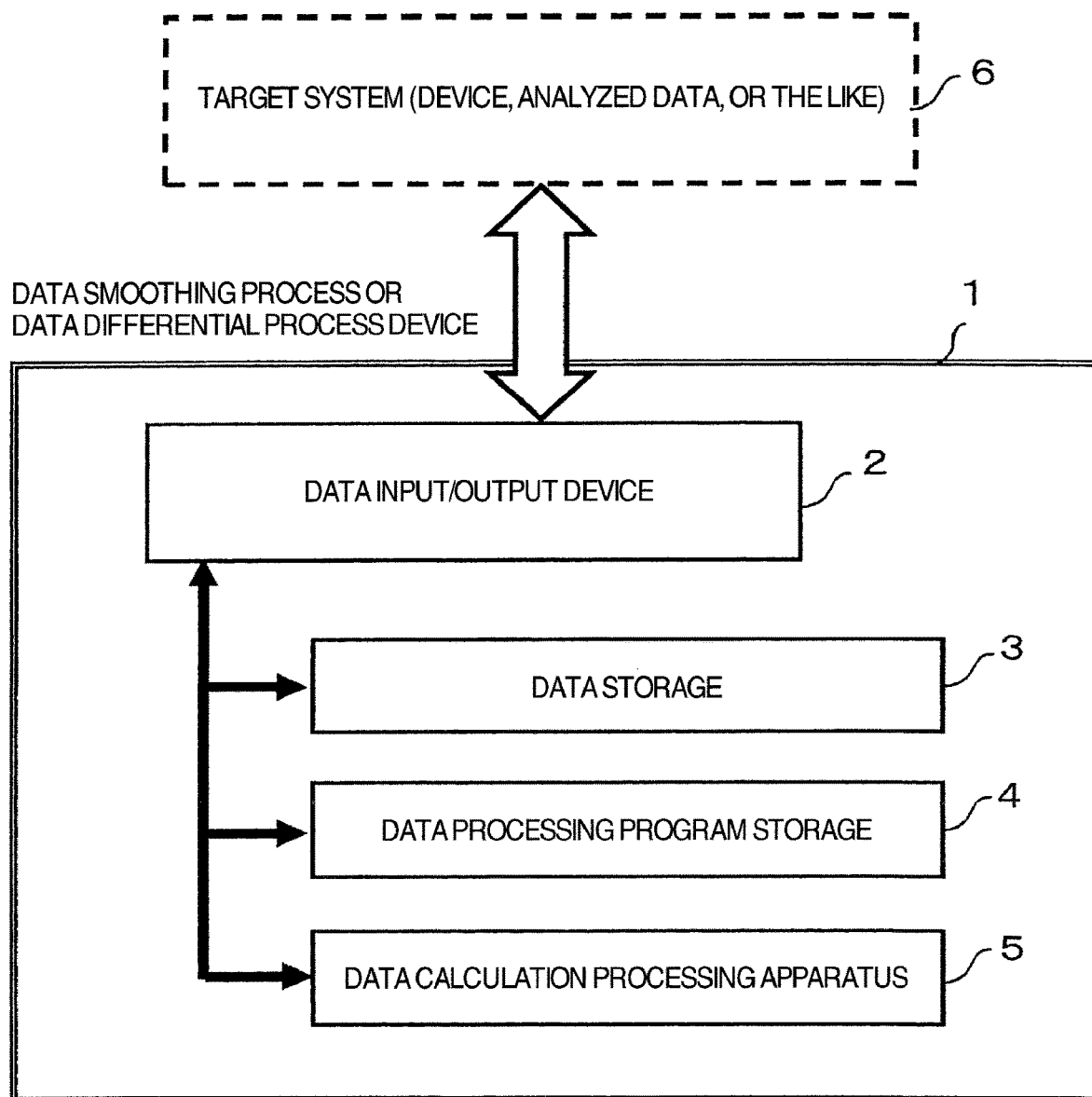
FIG. 1 is a diagram showing the entire configuration of a data processing apparatus 1 according to a first embodiment.

FIG. 1 shows a configuration diagram of a data processing apparatus 1 of the first embodiment. In the present embodiment, the data processing apparatus 1 is configured by a data input/output device 2, a data storage 3 being a storage, a data processing program storage 4, and a data calculation processing apparatus 5, which are connected to one another so as to exchange data. In addition to the above, a data display (not shown) is further provided as needed. The data processing apparatus 1 can perform input/output of data with a target system 6 (device, analyzed data, or the like). The data processing apparatus 1 thereby controls the target system 6 with high precision. In the case of the present embodiment, the target system 6 is a microwave plasma processing system. Furthermore, the data processing apparatus 1 may be used standalone and can be used for data analysis or the like.

The data input/output device 2 can input/output processed data or parameters of a data processing program. The data input/output device 2 receives data to be processed collectively or sequentially, from the target system 6 or the like, stores the data in the data storage 3 such as a RAM, subjects the data to a data smoothing process and a data differential process using the data calculation processing apparatus 5 according to the data processing program stored in the data processing program storage 4 such as a RAM, and outputs the result data on the data smoothing process and the result data on the data differential process to the target system 6 or the like using data input/output device 2, which are used for controlling the target system 6.

Figure 2:
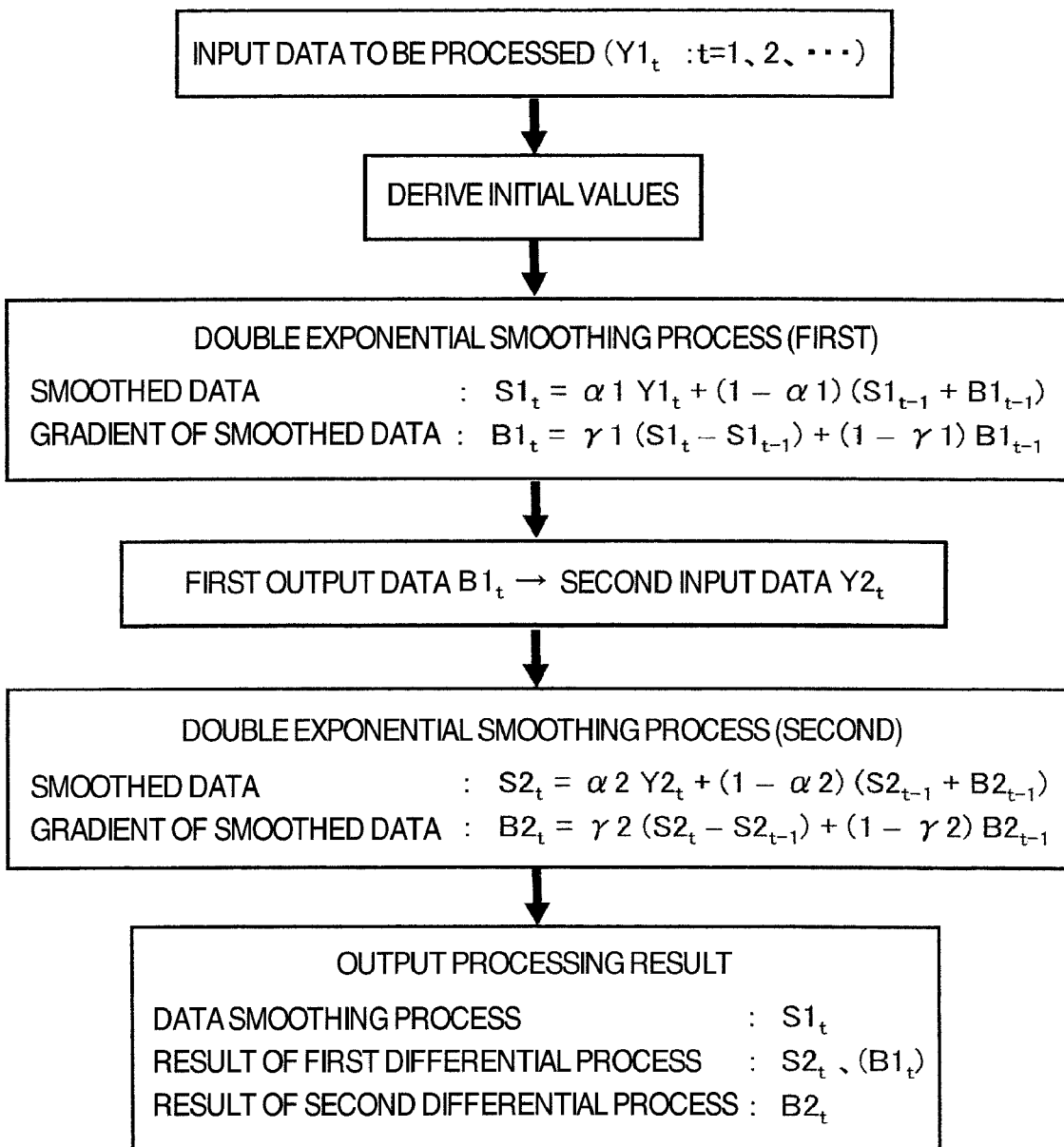
FIG. 2 is a diagram showing the flow of data processing according to the first embodiment.

FIG. 2 shows the total flow of a data processing method stored in the data processing program. The data to be processed collectively or sequentially is received and input. In the present embodiment, the input data is defined as time series data $Y1_t$: t=1, 2, . . . . Next, initial values are derived according to a method to be described hereafter. Next, a first-time double exponential smoothing process is performed by the following expressions (1) and (2), and a predicted value $S1_t$ of data smoothing and a predicted value $B1_t$ of the gradient of smoothed data of the first output are obtained.

Data smoothing: $S1_t = \alpha 1 Y_t + (1-\alpha 1)(S1_{t-1} + B1_{t-1})$  Expression (1)

Gradient of the smoothed data: $B1_t = \gamma 1 (S1_t - S1_{t-1}) + (1-\gamma 1) B1_{t-1}$  Expression (2)

Next, a second-time double exponential smoothing process is performed, in which the predicted value $B1_t$ of the gradient of the smoothed data in the first output is set as a second input data $Y2_t$, and a predicted value $S2_t$ of data smoothing and a predicted value $B2_t$ of the gradient of smoothed data of the second output are obtained. Next, result data on the data smoothing process $S1_t$, result data on a first differential data process $S2_t$, and result data on second differential data processing $B2_t$ are output collectively or sequentially. Here, a smoothing parameter $\alpha 1$ of the data smoothing and a smoothing parameter $\gamma 1$ of the gradient of the smoothed data in the first-time double exponential smoothing, and a smoothing parameter $\alpha 2$ of the data smoothing and a smoothing parameter $\gamma 2$ of the gradient of the smoothed data in a second-time double exponential smoothing are set at arbitrary constants in advance.

Note that $0<\alpha 1<1$, $0<\gamma 1<1$, $0<\alpha 2<1$, and $0<\gamma 2<1$. The predicted value $B1_t$ of the gradient of the smoothed data of the first output may be used since it is equivalent to the processing result of the first differential, but the data result varies widely, and thus a data smoothing process is performed by the second-time double exponential smoothing process.

Figure 3:
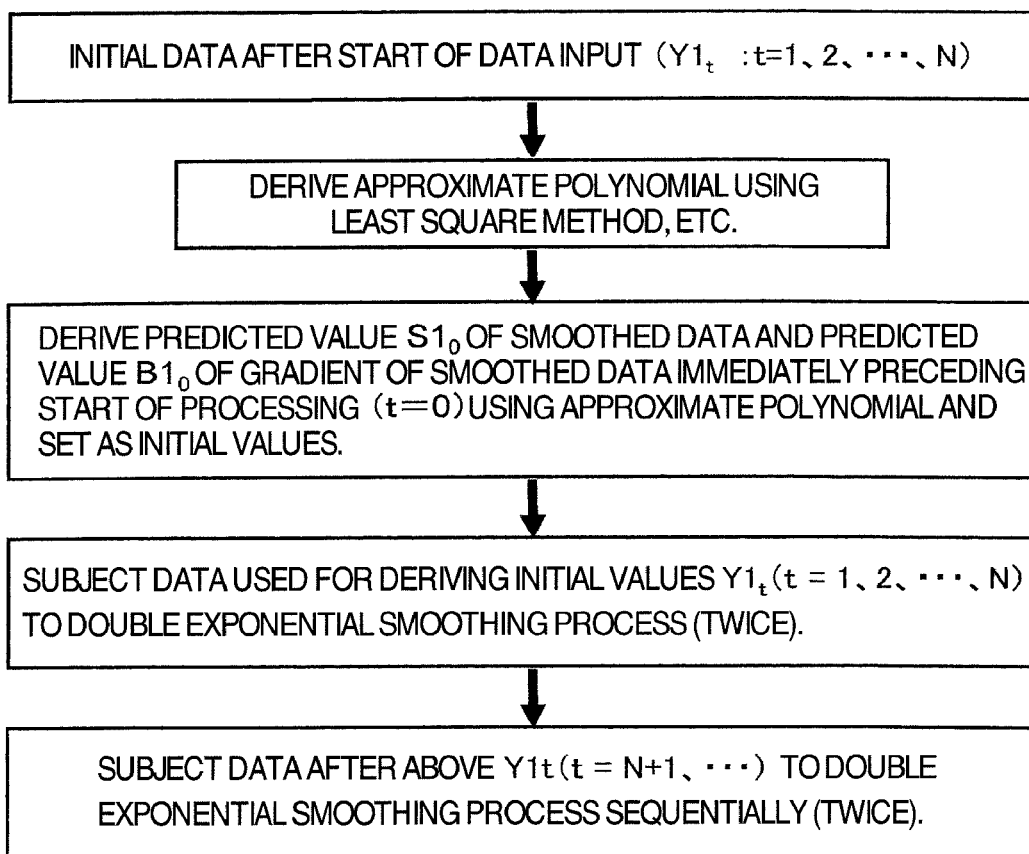
FIG. 3 is a diagram showing the flow of deriving an initial value in the first embodiment.

FIG. 3 shows a flowchart of deriving the initial values in the present embodiment. The initial value of the predicted value S1 of the data smoothing and the initial value of the predicted value B1 of the gradient of the smoothed data in the double exponential smoothing process are typically derived by, for example, the following method. The initial value of the predicted value S1 of the data smoothing is derived by S1=input data Y1 (method A1), or S1=the average value ($\{Y1+Y2+ \ldots +YN\}/N$) of the number of initial pieces of the input data (method A2), or the like. The initial value of the predicted value B1 of the gradient of the smoothed data is derived by B1=Y2−Y1 (method B1), B2=$\{(Y2−Y1)+(Y4−Y3)\}/2$ (method B2), or the like.

In general, there has been a problem with the double exponential smoothing process of developing a large error immediately after the start of the data processing. One of the causes thereof is that initial values by the above conventional method of deriving have large errors with respect to a predicted value of data smoothing to initial pieces of actual data and a predicted value of the gradient of smoothed data on the initial pieces of actual data, respectively. In addition, in conventional methods, initial values are derived using the desired number N of initial pieces of data and (N+1)th and subsequent pieces of the input data of $Y_{N+1}$, . . . are thereafter subjected to the double exponential smoothing process, but the number N of initial pieces of the input data are not subjected to the double exponential smoothing process, which results in the lack of data output results corresponding to the above period.

In particular, if the number of pieces of input data to be processed is small, the effect of the lack of the above data output result becomes prominent. For the above reasons, there has been a problem that, if the state of a target system changes immediately after the beginning of the data, it is difficult to control the target system with high precision due to the large errors in the data processing immediately after the start of the data processing, or the lack of the data output result immediately after the beginning of the data.

As shown in FIG. 3, in the present embodiment, an approximate polynomial is derived by the least squares method using the desired number N of initial pieces of data $Y1_t$ (t=1, 2, . . . , N) after the start of the data input. In the present embodiment, ten pieces of time series data with isochronous intervals are used. With the approximate polynomial derived in the above, a predicted value $S1_0$ of data smoothing, which is virtual data at t=0 immediately preceding the input data, and the predicted value $B1_0$ of the gradient of the smoothed data are derived. In the present embodiment, a linear function is used as the approximate polynomial, and the predicted value $S1_0$ of the data smoothing, and the predicted value $B1_0$ of the gradient of the smoothed data are calculated by Expressions (3) and (4), respectively.

The predicted value $S1_0$ of the data smoothing=$\{330Y1_1+275Y1_2+220Y1_3 165Y1_4+110Y1_5+55Y1_6+0Y1_7−55Y1_8−110Y1_9−165Y1_{10}\}/825$  Expression (3)

The predicted value $B_0$ of the gradient of the smoothed data=$\{−45Y1_1−35Y1_2−25Y1_3−15Y1_4−5Y1_5+5Y1_6+15Y1_7+25Y1_8+35Y1_9+45Y1_{10}\}/825$  Expression (4)

In addition, an initial value $S2_1$ of the predicted value of the data smoothing and an initial value $B2_1$ of the predicted value of the gradient of the smoothed data, in the second-time double exponential smoothing process shown in FIG. 2, are set at $S2_1=S1_1$, and $B2_1=0$, respectively. In the case of sequential data processing, the initial values are derived after inputting the number N of initial pieces of the data, and thereafter the number N of initial pieces of the data are sequentially subjected to the double exponential smoothing process, and the results of the data smoothing process and the data differential process are output. Thereafter (subsequent to t=N+1), the double exponential smoothing process is sequentially performed every input of a piece of the data, and the results of the data smoothing process and the data differential process are output in real time. For this reason, according to the present embodiment, there is an advantage of performing the data smoothing process and the data differential process with small errors and high precision even to the initial pieces of the input data after the start of the data input.

Figure 4:
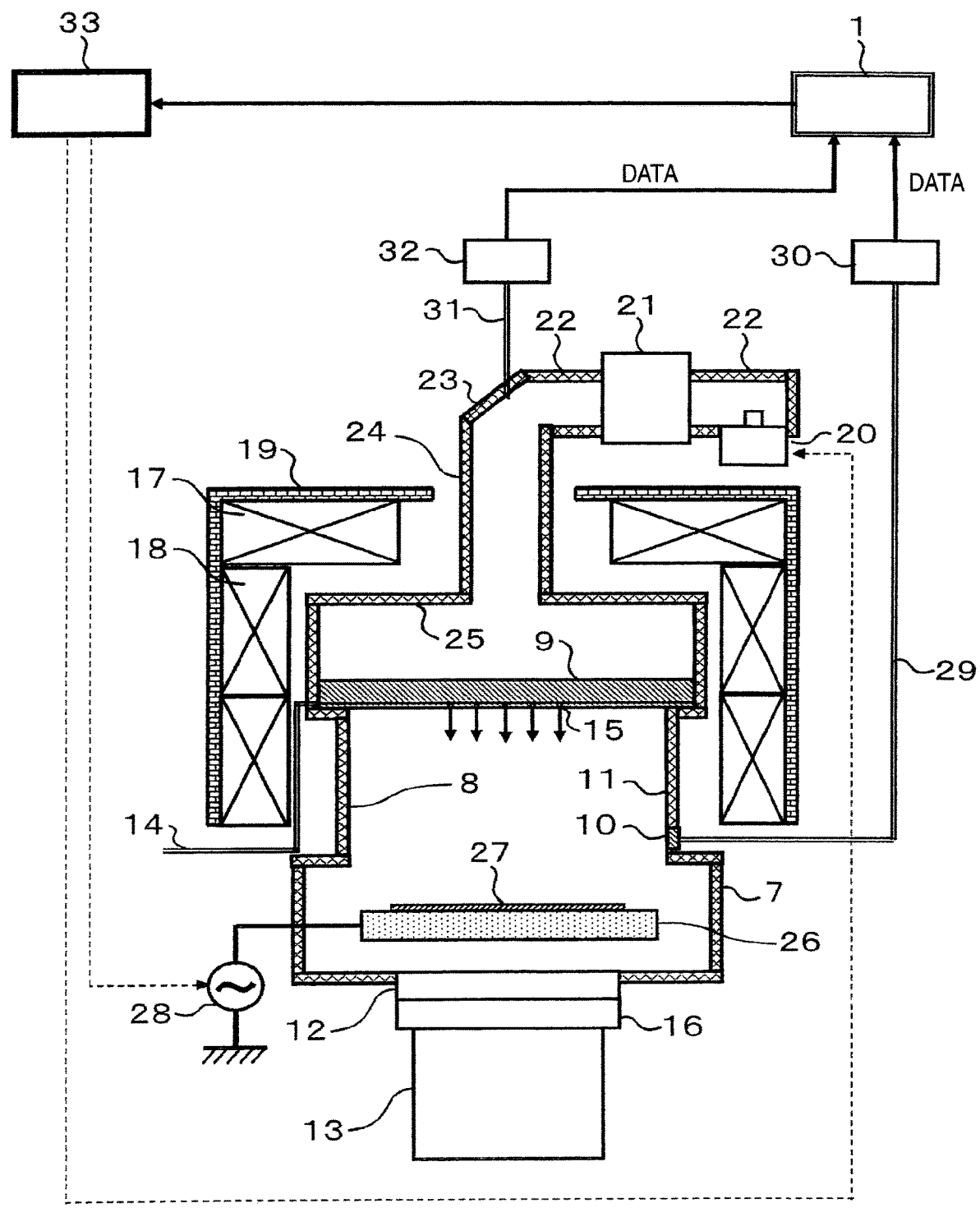
FIG. 4 is a vertical cross sectional view of an electron cyclotron resonance microwave plasma etching system according to the first embodiment.

FIG. 4 shows a vertical cross sectional view of an electron cyclotron resonance microwave plasma etching system according to the first embodiment of the present invention. In the present embodiment the electron cyclotron resonance microwave plasma etching system corresponds to the target system 6 (device, analyzed data, or the like) of FIG. 1. A vacuum pumping apparatus 13 decompresses the inside of a processing chamber 11, which is defined by a container 7, a discharge tube 8, a quartz plate 9, and a quartz window 10, by opening an exhaust valve 12. Etching gas passes though gas piping 14 via a mass flow controller (not shown), passes through between the quartz plate 9 and a quartz shower plate 15, and is led into the processing chamber 11 through the gas holes of the quartz shower plate 15. The pressure of the etching gas led into the processing chamber 11 is adjusted to a desired pressure by a pump speed control valve 16.

In addition, the processing chamber 11 is in a magnetic field generated by coils 17 and 18 and a yoke 19. Microwaves having a frequency of 2.45 GHz in this case oscillated by a magnetron 20 propagate through a rectangular waveguide 22 via an isolator (not shown), a power monitor (not shown), a matching box 21, in a rectangular TE10 mode, and propagate through a circular waveguide 24 via a rectangular-to-circular mode converter 23, in a circular TE11 mode. The microwaves are thereafter led into a cavity resonator 25, and penetrate through the quartz plate 9 and the quartz shower plate 15 to enter into the processing chamber 11. A magnetic field region having a magnetic flux density of 875 Gauss that produces electron cyclotron resonance with the led microwaves of 2.45 GHz is formed all over the processing chamber 11 in a direction perpendicular to the central axis of the processing chamber 11 and to a direction of leading the microwaves, and in a cross-sectional direction with respect to the central axis of the processing chamber 11.

With plasma produced mainly by the interaction between the microwaves of 2.45 GHz and the magnetic field of 875 Gauss, a wafer 27 placed on a wafer mounting electrode 26 being a sample stage (holder) is subjected to an etching process. In addition, a radio frequency power source 28 is connected to the wafer mounting electrode 26 via the matching box (not shown) in order to control the etch profile of the wafer 27 being a sample, which allows radio frequency voltage to be applied. Furthermore, a chiller unit (not shown) is connected to the wafer mounting electrode 26, which allows the temperature of the wafer 27 to be controlled.

The processing chamber 11, the wafer 27, and the wafer mounting electrode 26 are disposed coaxially, and a gas hole region of the quartz shower plate 15 for leading the etching gas, the exhaust valve 12 being an evacuating section, the pump speed control valve 16, and the vacuum pumping apparatus 13 are also disposed coaxially with respect to the processing chamber 11. Thus, the flow of gas above the wafer 27 is coaxial and symmetrical. The coils 17 and 18, and the yoke 19 for producing the magnetic field are also disposed coaxial with respect to the processing chamber 11, and thus a magnetic field profile in the processing chamber 11 and an electron cyclotron resonance region having a magnetic flux density of 875 Gauss are formed coaxial with respect to the processing chamber 11. In addition, the circular waveguide 24 and the cavity resonator 25 are also disposed coaxially with respect to the processing chamber 11, and thus the microwaves led into the processing chamber 11 are also led coaxially with respect to the processing chamber 11.

Since the magnetic field is formed coaxially with respect to the processing chamber 11 and the microwaves are led coaxially with respect to the processing chamber 11, the plasma produced by the interaction between the magnetic field and the microwaves is produced coaxially with respect to the processing chamber 11, and electrons and ions in the plasma are transported coaxially with respect to the wafer 27. In addition, since the flow of the etching gas is coaxial with respect to the processing chamber 11, radicals produced by the plasma or the byproducts produced by etching the wafer 27 are also led and exhausted coaxially with respect to the wafer 27. As a result, it is possible to perform etching process with etching process performances such as an etching rate, a material selectivity, and an etch profile well uniformed across the surface of the wafer.

Light from the plasma produced in the processing chamber 11 through a lateral side of the processing chamber 11 is led into a spectroscope 30 via the quartz window 10 and an optical fiber 29, and is output as wavelength-dependent time series data on the intensity of the light. In addition, light through the upper side of the processing chamber 11 is led into a spectroscope 32 via the quartz shower plate 15, the quartz plate 9, the cavity resonator 25, the circular waveguide 24, the rectangular-to-circular mode converter 23, and an optical fiber 31, and output as wavelength-dependent time series data on the intensity of the light.

Into the processing chamber 11, etching byproducts from the etching gas and the wafer 27 are led, and they are dissociated by the interaction between the microwave and the magnetic field to generate plasma. For this reason, the light from the plasma produced in the processing chamber 11 contains information on atoms, molecules, radicals, and the reactants thereof that compose the etching gas and the etching byproducts.

For example, in typical poly-Si etching of a Si substrate in which a poly-Si film and a $SiO_2$ film is disposed underneath a mask pattern, it is required to perform the poly-Si etching with a high selectivity to a $SiO_2$. A halogen-based gas is used as the etching gas, and the etching byproducts include a Si and a halogen, being a member to be etched. The etching byproducts are dissociated by the plasma again, and thus the spectroscope 30 and the spectroscope 32 monitor the intensity of the light emission having a wavelength of 288 nm that is originated from a Si from the plasma. In this case, when the etching of the poly-Si film is completed and the $SiO_2$ is exposed, the intensity of the plasma emission having the wavelength of 288 nm that is originated from a Si sharply lowers and finally approaches a certain value since the etching rate of the $SiO_2$ is small. The changes in the plasma emission are monitored to detect the end point of etching process.

The light through the lateral side of the processing chamber 11 contains the information on the etching gas and the etching byproducts, and the light through the upper side of the processing chamber 11 contains, in addition to the information, information on the membrane structure and the stepped structure of the wafer 27 because the interference of the plasma light occurs in the membrane structure and the stepped structure of the wafer 27. It is possible to monitor the thickness of film and the depth of etching in the etching by analyzing data on the plasma emission. In the present embodiment, for ease of description, data on the plasma emission through the lateral side of the processing chamber 11 is used for monitoring the end point of etching process.

FIG. 5 shows a typical data processing flow of detecting the end point of etching process. Input data is created by an evaluation function of Expression (5) that simulates changes in the intensity of plasma emission in an etching.

$$Y(t)=H/[1+\exp\{-A(t-T)\}]+Ct+D+F(R-0.5) \quad \text{Expression (5)}$$

Here, H, A, T, C, D, and F are arbitrary constants, and R is a random number ranging from 0 to 1. Using the evaluation function allows for comparing and evaluating data processing performances in various methods of data processing, such as absolute errors with respect to actual values, a retardation time associated with the data processing, and a S/N ratio (signal/noise), since analytic actual values in a data smoothing process, a first differential process, and a second differential process are known.

As shown in FIG. 5, in the typical data processing of detecting the end point of etching process, an input data waveform shown in the (A) of FIG. 5 is subjected to a data smoothing process as shown in the (B) of FIG. 5, and thereafter subjected to a first differential process as shown in the (C) of FIG. 5 and to a second differential process as shown in the (D) of FIG. 5. The data smoothing process clarifies a changing point in the input data containing much noise. The changing point is detected as a point (point in time) at a peak value through the first differential process, and detected as a point (point in time) at zero crossing through the second differential process. With this as a basis, the end point of etching process is determined, and the etching device is thereby controlled to perform the etching process with high precision.

The changing point becomes more clearly and simply determinable with the peak through the first differential process and the zero crossing through the second differential process, gradually, but the absolute value of the intensity of signal gradually becomes small. For this reason, data processing with a high S/N ratio is important. In particular, in the cases of etching in which area to be etched is small or etching in which a mask pattern having a low aperture ratio is used, data processing with an even higher S/N ratio since the changes in the intensity of plasma emission across the end point of etching process is small. In general, in the data smoothing process and the data differential process, a retardation time becomes longer as an S/N ratio becomes high, which makes an absolute error with respect to an actual value large. That is, the relationship between the S/N ratio and the retardation time and the absolute error is a tradeoff; and a data smoothing process and a data differential process that simultaneously satisfy the S/N ratio, the retardation time, and the absolute error, are needed.

In the present embodiment, the data processing shown in FIG. 5 is performed using the flows of the data smoothing process and the data differential process of FIG. 2 and FIG. 3. In addition, the input data of FIG. 5 is equivalent to the output data from the spectroscope 30 for monitoring the plasma emission in the etching in the electron cyclotron resonance microwave plasma etching system of FIG. 4. As shown in FIG. 4, a system controller 33 (including a data input/output device, a data processing apparatus, and a data display) for controlling the electron cyclotron resonance microwave plasma etching system as a system, and the data processing apparatus 1 of the present embodiment are provided. The data processing apparatus 1 may be incorporated as part of the system controller 33.

The output data from the spectroscope 30 and the spectroscope 32 is transmitted to the data processing apparatus 1, and the result of data smoothing process, the result of first data differential, and the result of second data differential are transmitted to the system controller 33 being a controller. The system controller 33 determines the end point of etching process on the basis of the result of data smoothing process, the result of first data differential, and the result of second data differential, and controls the electron cyclotron resonance microwave plasma etching system as a system. In FIG. 4, connection between the system controller 33, and the magnetron 20 and the radio frequency power source 28 is shown because, in the determination of the end point of etching process, plasma production is mainly controlled. In addition, the system controller 33 is connected to other devices configuring the system, the illustrations of which are omitted in FIG. 4.

Figure 6A:
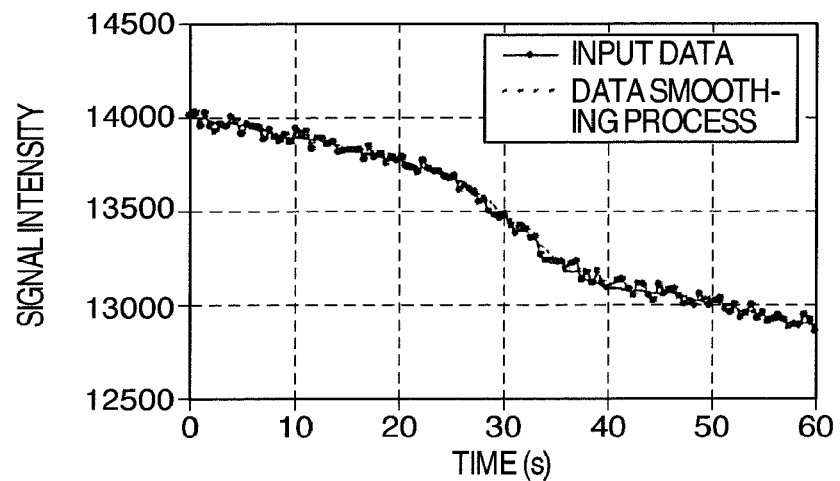
FIGS. 6A-C show the results of data processing by the data processing apparatus of the first embodiment.
Figure 6B:
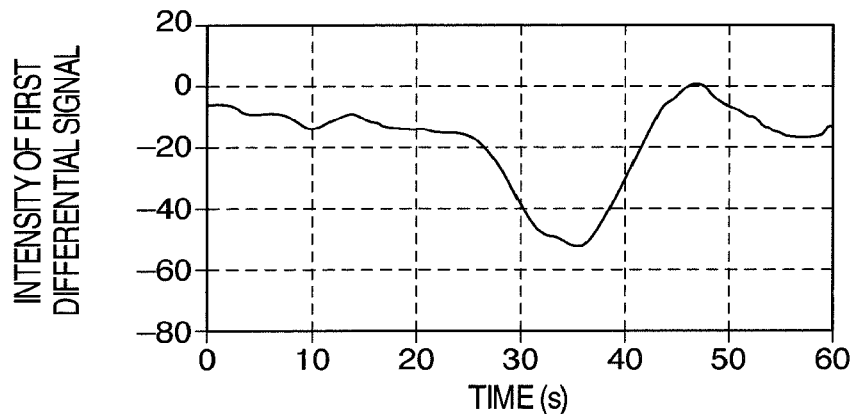
Figure 6C:
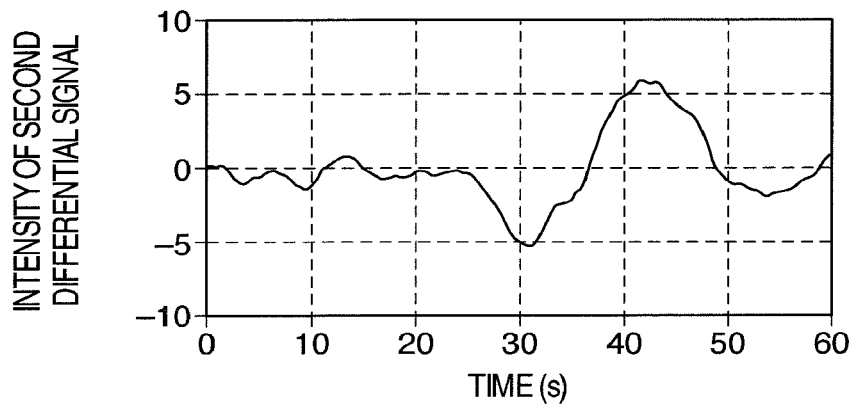
Figure 7A:
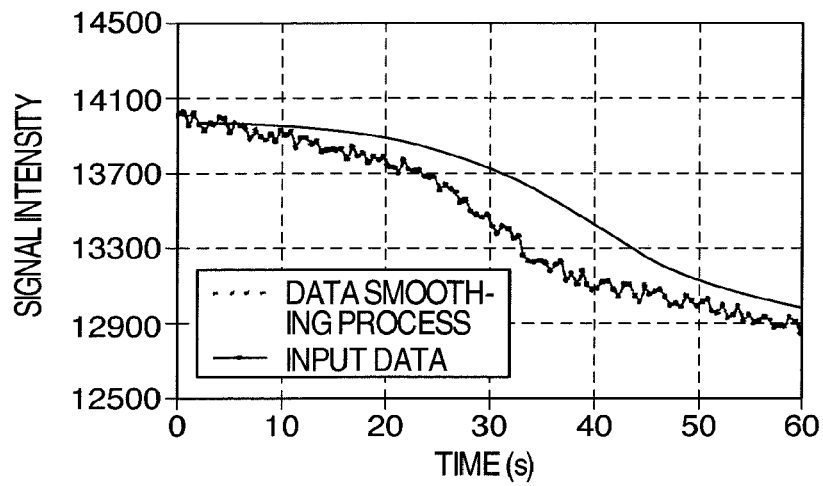
FIGS. 7A-C are the data processing results of data smoothing and a data differential process with a conventional low-pass filter and by finite difference method.
Figure 7B:
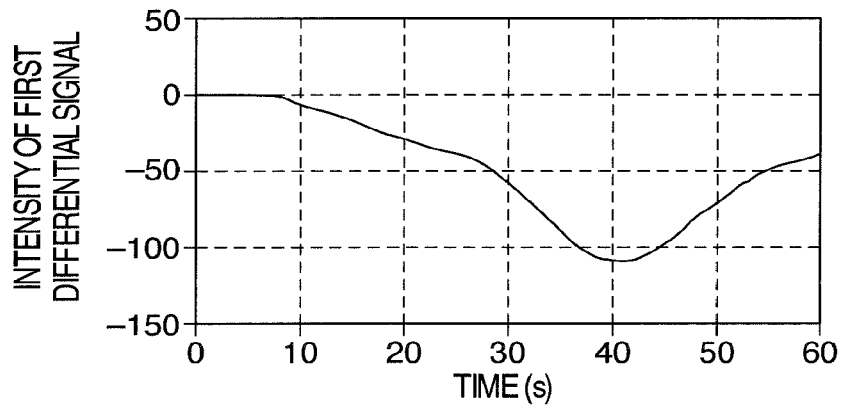
Figure 7C:
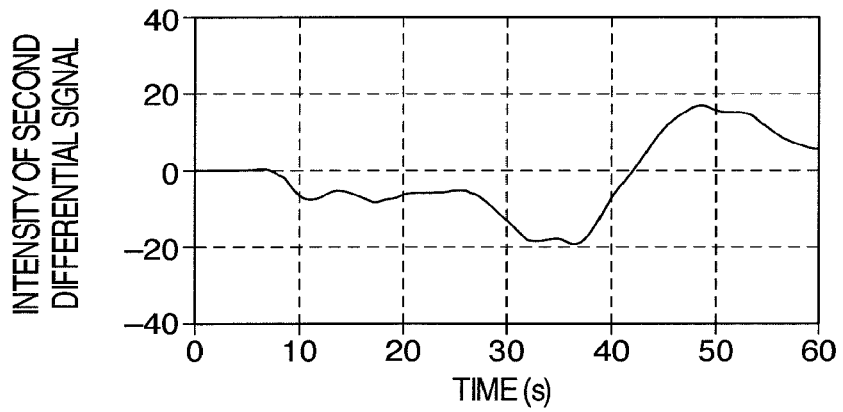

FIGS. 6A-C show the results of the data processing by the data processing apparatus 1 of the first embodiment of the present invention. FIG. 6A shows input data and a waveform after the data smoothing process, FIG. 6B shows a waveform after the first differential process, and FIG. 6C shows a waveform after the second differential process. In addition, FIGS. 7A-C show the results of data processing performed by the data processing apparatus 1 using a low-pass filter and a finite difference method of prior art. In this case, a cut-off frequency of the low-pass filter is set at 0.025 Hz. FIG. 7A shows input data and a waveform after data smoothing process, FIG. 7B shows a waveform after a first differential process, and FIG. 7C shows a waveform after a second differential process. Here, the pieces of input data used for FIGS. 6A-C and FIGS. 7A-C are the same.

As compared between FIGS. 6A-C and FIGS. 7A-C, as shown in FIG. 6A, with the data smoothing process and data differential process device of the first embodiment of the present invention, the absolute errors between the input data and the result of data smoothing process are very small, and it can be understood that the data smoothing process is preferably performed. In addition, as shown in FIG. 6B and FIG. 6C, the first differential process and the second differential process can be performed with high S/N ratios. For this reason, it is possible to clearly detect the point (point in time) at a peak in the first differential and a point (point in time) at zero crossing in the second differential, which are criteria for determining the end point of etching process. Comparing data processing performances using numerical data, the above absolute error is 22.4 by the data smoothing process and the data differential process device of the first embodiment of the present invention, whereas being 191.2 by the low-pass filter and the finite difference method of prior art.

Furthermore, the S/N ratio is 32 by the data smoothing process and the data differential process device of the first embodiment of the present invention, whereas being 28 by the low-pass filter and the finite difference method of prior art. The zero crossing time point in the second differential by the data smoothing process and the data differential process device of the first embodiment of the present invention is earlier by 5.4 seconds than that by the low-pass filter and the finite difference method of prior art, which means that the retardation time is short.

According to the first embodiment of the present invention, there is an advantage of consecutively performing the data smoothing process and the data differential process with a small error of absolute value, a high S/N ratio, and a short retardation time, in real time.

Second Embodiment

A data processing apparatus according to a second embodiment of the present invention will be next described.

In the present embodiment, Expressions (1) and (2) of the first-time double exponential smoothing process, in FIG. 2 showing the total flow of the method of the data smoothing process and the data differential process in the first embodiment of the present invention, are replaced with the following Expressions (6) to (15).

Data smoothing: $S1_t = \alpha 1_t Y_t + (1-\alpha 1_t)(S1_{t-1} + B1_{t-1})$  Expression (6)

Gradient of the smoothed data: $B1_t = \gamma 1_t (S1_t - S1_{t-1}) + (1-\gamma 1_t) B1_{t-1}$  Expression (7)

Smoothing parameter: $\alpha 1_t = (K_\alpha - L_\alpha) F_\alpha + L_\alpha$  Expression (8)

Response coefficient: $F_\alpha = (|\delta\alpha_t / \Delta\alpha_t| + \varphi)^N$  Expression (9)

Relative error: $\delta\alpha_t = A1(Y_t - S1_t) + (1-A1)\delta\alpha_{t-1}$  Expression (10)

Absolute error: $\Delta\alpha_t = A1|Y_t - S1_t| + (1-A1)\Delta\alpha_{t-1} + \varphi$  Expression (11)

Smoothing parameter: $\gamma 1_t = (K_\gamma - L_\gamma) F_\gamma + L_\gamma$  Expression (12)

Response coefficient: $F_\gamma = (|\delta\gamma_t / \Delta\gamma_t| + \varphi)^N$  Expression (13)

Relative error: $\delta\gamma_t = A2\{(S1_t - S1_{t-1}) - B_t\} + (1-A2)\delta\gamma_{t-1}$  Expression (14)

Absolute error: $\Delta\gamma_t = A2|(S1_t - S1_{t-1}) - B_t| + (1-A2)\Delta\gamma_{t-1} + \varphi$  Expression (15)

Here, $K_\alpha$, $L_\alpha$, $K_\gamma$, $L_\gamma$, N, A1, A2, and $\varphi$ are arbitrary constants. Note that $1 > K_\alpha > L_\alpha > 0$, $1 > K_\gamma > L_\gamma > 0$, $1 > A1 > 0$, and $1 > A2 > 0$. The constant $\varphi$ is provided for preventing the absolute errors $\Delta\alpha_t$ and $\Delta\gamma_t$, and the response coefficients $F_\alpha$ and $F_\gamma$ from becoming zero, and an infinitesimal value are selected therefor so as to significantly lessen effects on normal calculations.

Expression (6) of the data smoothing and Expression (7) of the gradient of the smoothed data have forms basically same as those in the case of the first embodiment of the present invention of FIG. 2, but as shown in Expression (8) and Expression (12), the smoothing parameter $\alpha 1_t$ sequentially varies within the range of $K_\alpha > \alpha 1_t > L_\alpha$, and the smoothing parameter $\gamma 1_t$ sequentially varies within the range of $K_\gamma > \gamma 1_t > L_\gamma$, according to the state of the data processing. In addition, as shown in Expression (9) and Expression (13), the response coefficient $F_\alpha$ is an exponential response to the absolute value of the relative error/absolute error of the data smoothing, and the response coefficient $F_\gamma$ is an exponential response to the absolute value of the relative error/absolute error of the gradient of the smoothed data. Expression (10), Expression (11), Expression (14), and Expression (15) perform accumulation and smoothing such that recent pieces of data have greater effects and past pieces data have exponentially reduced effects, and constants A1 and A2 are parameters for performing an exponential accumulation and smoothing.

Expression (10) for the relative error $\delta\alpha_t$ and Expression (11) for the absolute error $\Delta\alpha_t$ calculate the relative error and the absolute error between the input data $Y_t$ and predicted value $S1_t$ of the data smoothing, respectively. In addition, Expression (14) for the relative error $\delta\gamma_t$ and Expression (15) for the absolute error $\Delta\gamma_t$ calculate the relative error and the absolute error between the gradient $(S1_t - S1_{t-1})$ of the predicted value of the data smoothing and the predicted value $B_t$ of the gradient of the smoothed data.

Figure 8:
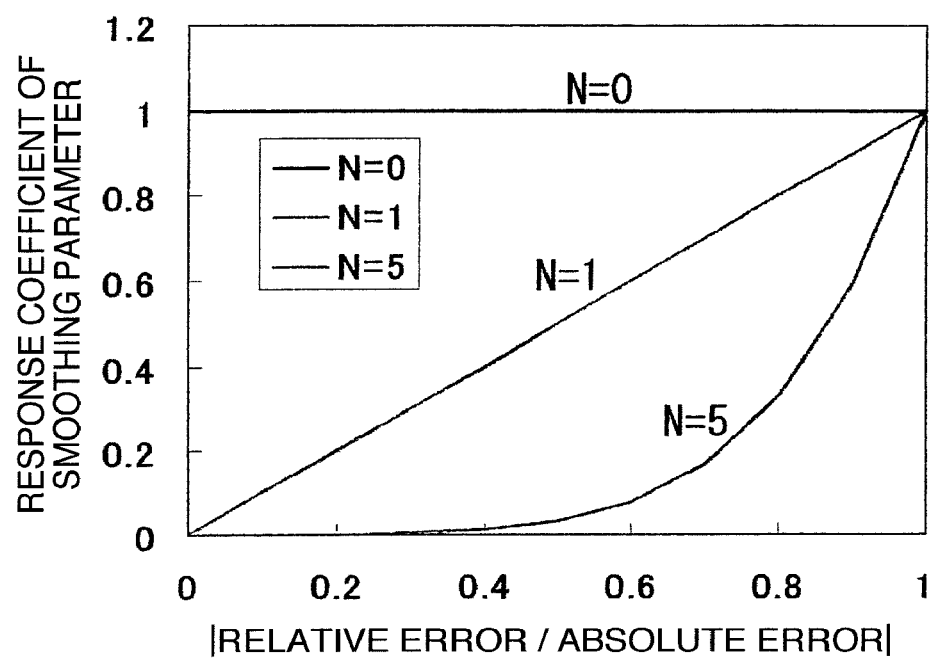
FIG. 8 is a diagram showing a relation between a response coefficient and the absolute value of relative error/absolute error in a second embodiment when an exponentiation N is used as a parameter.

FIG. 8 shows a relation between a response coefficient and the absolute value of relative error/absolute error in a second embodiment of the present invention when an exponentiation N is used as a parameter. The absolute value of relative error/absolute error can evaluate a difference between the input data and the predicted value of the data smoothing within a range of a maximum value of one to a minimum value of zero. If the absolute value of relative error/absolute error is zero, the input data and the predicted value of the data smoothing match. As shown in FIG. 8, when N=0, the response coefficient of the smoothing parameter is one, and a smoothing parameter becomes constant, which is the same as the first embodiment of the present invention.

When N=1, the response coefficient increases from zero to one in proportion to the absolute value of the relative error/absolute error, and thus the smoothing parameter similarly increases from a minimum value to a maximum value. When N=5, the response coefficient increases from zero to one with the fifth power of the absolute value of the relative error/absolute error, and thus the smoothing parameter similarly increases from a minimum value to a maximum value with a responsiveness of the fifth power. That is, as compared between the cases of N=1 and N=5, the smoothing parameter of the case of N=5 has properties of remaining smaller even if the input data somewhat differs from the predicted value of the data smoothing, and in contrast, of sharply increasing the smoothing parameter when the input data largely differs from the predicted value of the data smoothing.

If the smoothing parameter is small, the S/N ratio of the data processing increases but the absolute error increases, which makes the retardation time longer. On the other hand, if the smoothing parameter is large, the absolute error decreases and the retardation time is made shorter, but the S/N ratio of the data processing decreases. It is therefore needed to select an optimal smoothing parameter in accordance with the input data. The smoothing parameters are fixed in the first embodiment of the present invention, but in the second embodiment of the present invention, the smoothing parameters are adjusted sequentially in accordance with the difference between the input data and the predicted value of the data smoothing. For this reason, it is possible to avoiding the tradeoff between the S/N ratio of the data processing, and the absolute error and the retardation time, and to perform the data smoothing process and the data differential process with a high S/N ratio, a small absolute error, and a short retardation time.

Furthermore, the smoothing parameter is changed sequentially in accordance with the error between the input data and the predicted value of the data smoothing, or the like, but once the smoothing parameter becomes zero, the smoothing parameter is not changed thereafter. In addition, since the absolute error is made larger and the retardation time is made longer when the smoothing parameter is close to zero, setting a lower limit value of the smoothing parameter within a variable range has an advantage of performing a stable and optimal data processing in an adaptive double exponential smoothing process.

Figure 9A:
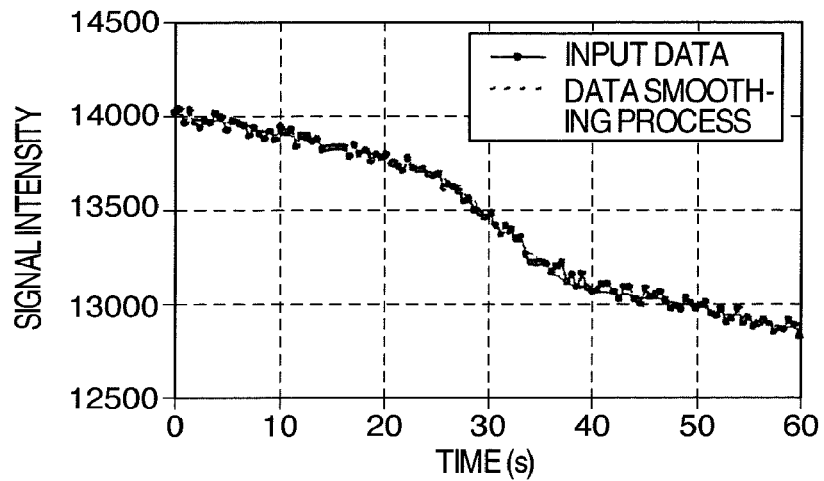
FIGS. 9A-C are graphs showing the data processing results when the exponential parameter N=1 in a data processing apparatus of the second embodiment.
Figure 9B:
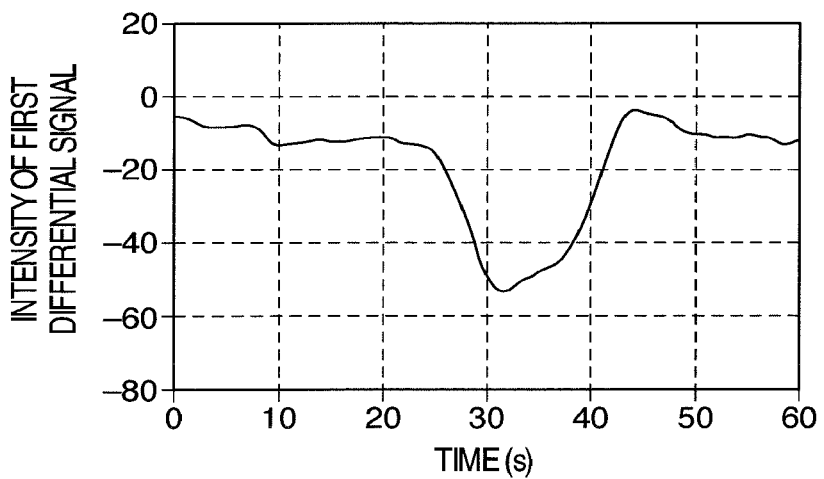
Figure 9C:
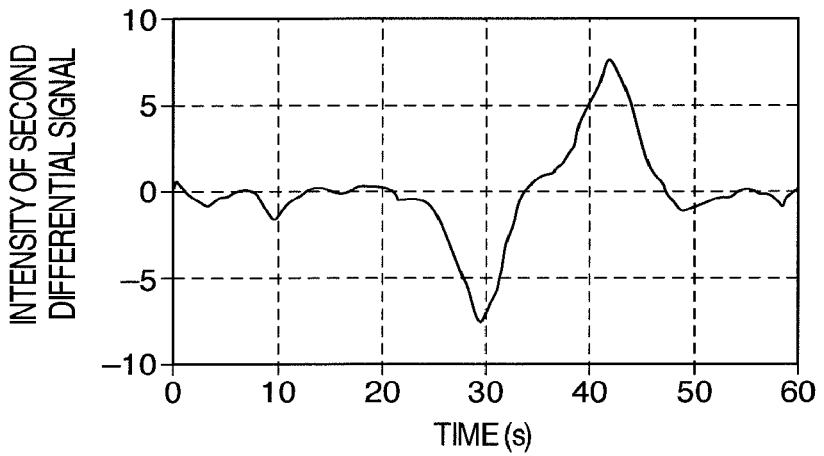

FIGS. 9A-C show the data processing results when the exponential parameter N=1 in the data smoothing process and the data differential process device of the second embodiment of the present invention. FIG. 9A shows input data and a waveform after data smoothing process, FIG. 9B shows a waveform after the first differential process, and FIG. 9C shows a waveform after the second differential process. In addition, FIGS. 10A-C shows the data processing results when the exponential parameter N=5 in the data processing apparatus of the second embodiment of the present invention. FIG. 10A shows input data and a waveform after data smoothing process, FIG. 10B shows a waveform after the first differential process, and FIG. 10C shows a waveform of a second differential process. Here, the pieces of input data used for FIGS. 9A-C and FIGS. 10A-C are the same as those for FIGS. 6A-C and FIGS. 7A-C.

As compared between FIGS. 9A-C and FIGS. 6A-C, with the data processing apparatus of the second embodiment of the present invention, when the exponential parameter N=1, as shown in FIG. 9B and FIG. 9C, the first differential process and the second differential process can be performed with a higher S/N ratio than the case of the first embodiment of the present invention. In addition, as compared between FIGS. 9A-C and FIGS. 10A-C, with the data processing apparatus of the second embodiment of the present invention, when the exponential parameter N=5, as shown in FIG. 10B and FIG. 10C, the first differential process and the second differential process can be performed with an even higher S/N ratio than the case where the exponential parameter N=1.

Comparing data processing performance using numerical data, the absolute error is 23.6 by the data smoothing process and the data differential process device of the second embodiment of the present invention when the exponential parameter N=1, whereas being 27.6 when the exponential parameter N=5. Furthermore, the S/N ratio is 226.5 when the exponential parameter N=1, whereas being 1607.2 when the exponential parameter N=5. The zero crossing time point in the second differential when the exponential parameter N=5 is earlier by 0.4 second than that when the exponential parameter N=1, which means that the retardation time is short. As a result, it is possible to optimally select the exponential parameter N and perform a desired data smoothing process and data differential process according to the degree of priorities among a high S/N ratio, an absolute error, and a retardation time in the data processing performances.

Figure 11A:
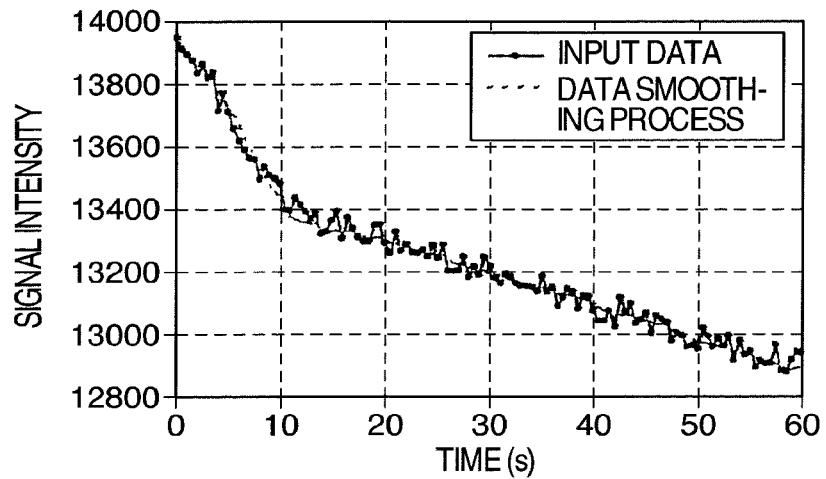
FIGS. 11A-C are graphs showing the data processing results in the case where a changing point of data follows immediately after the start of data input when the exponential parameter N=1 in the data processing apparatus of the second embodiment.
Figure 11B:
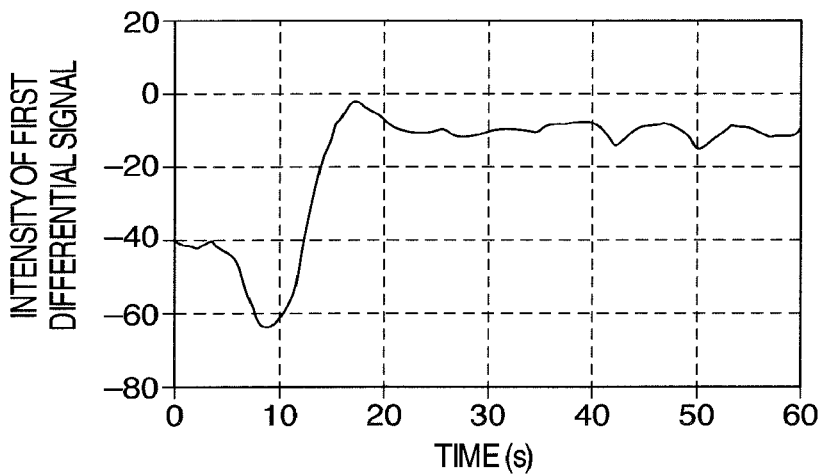
Figure 11C:
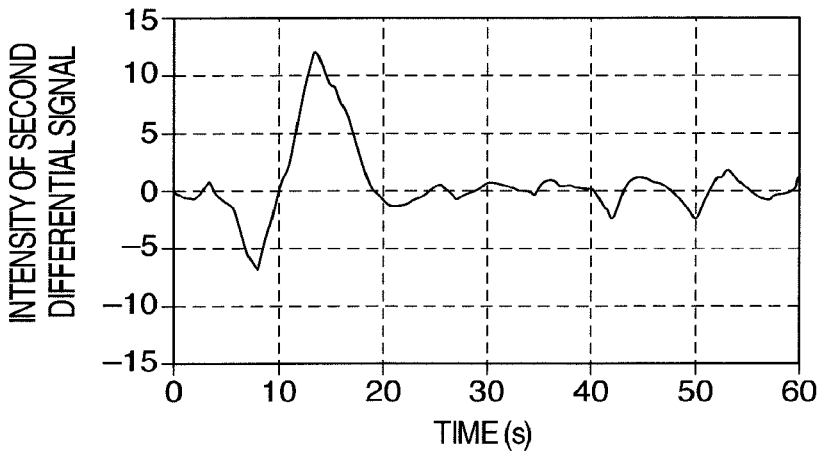

FIGS. 11A-C show the data processing results in the case where a changing point follows immediately after the start of data input when the exponential parameter N=1 in the data processing apparatus of the second embodiment of the present invention. The result of data smoothing process, the result of first differential process, and the result of second differential process are satisfactorily output based on the data immediately following the start of data input without lacking and with a small error even if a changing point of the data follows immediately after the start of the data input.

For this reason, the data processing apparatus of the second embodiment of the present invention is particularly useful for detecting the end point of etching process in a short-time etching process. In semiconductor etching, along with higher integration and finer geometries for semiconductor devices, there are increased steps of etching a multilayer thin film, and it is thus important to detect the end point of etching process in a short-time etching process or etching step. Deriving the predicted value of the data smoothing and the predicted value of the gradient of the smoothed data immediately preceding the start of data input using the approximate polynomial described with reference to FIG. 3 in the first embodiment of the present invention and setting them as initial values significantly contributes toward supporting the short-time process. In addition thereto, with the second embodiment of the present invention, the S/N ratio is improved in the first differential process and the second differential process, which allows for determining the end point of etching process even more clearly.

In the case of the present embodiment, in addition to the advantage of the first embodiment, it is possible to perform the data smoothing process and the data differential process with a high S/N ratio, overcoming the tradeoff relationship between the S/N ratio, and the error of absolute value and the retardation time, being the data processing performances, since the smoothing parameter is optimized sequentially in accordance with the error between the input data and the predicted value of the data smoothing, or the like. For this reason, there is an advantage of controlling a target system (devices or the like) with high precision since the state or the changes in the state in the target system (devices or the like) can be clearly detected.

Third Embodiment

Figure 12:
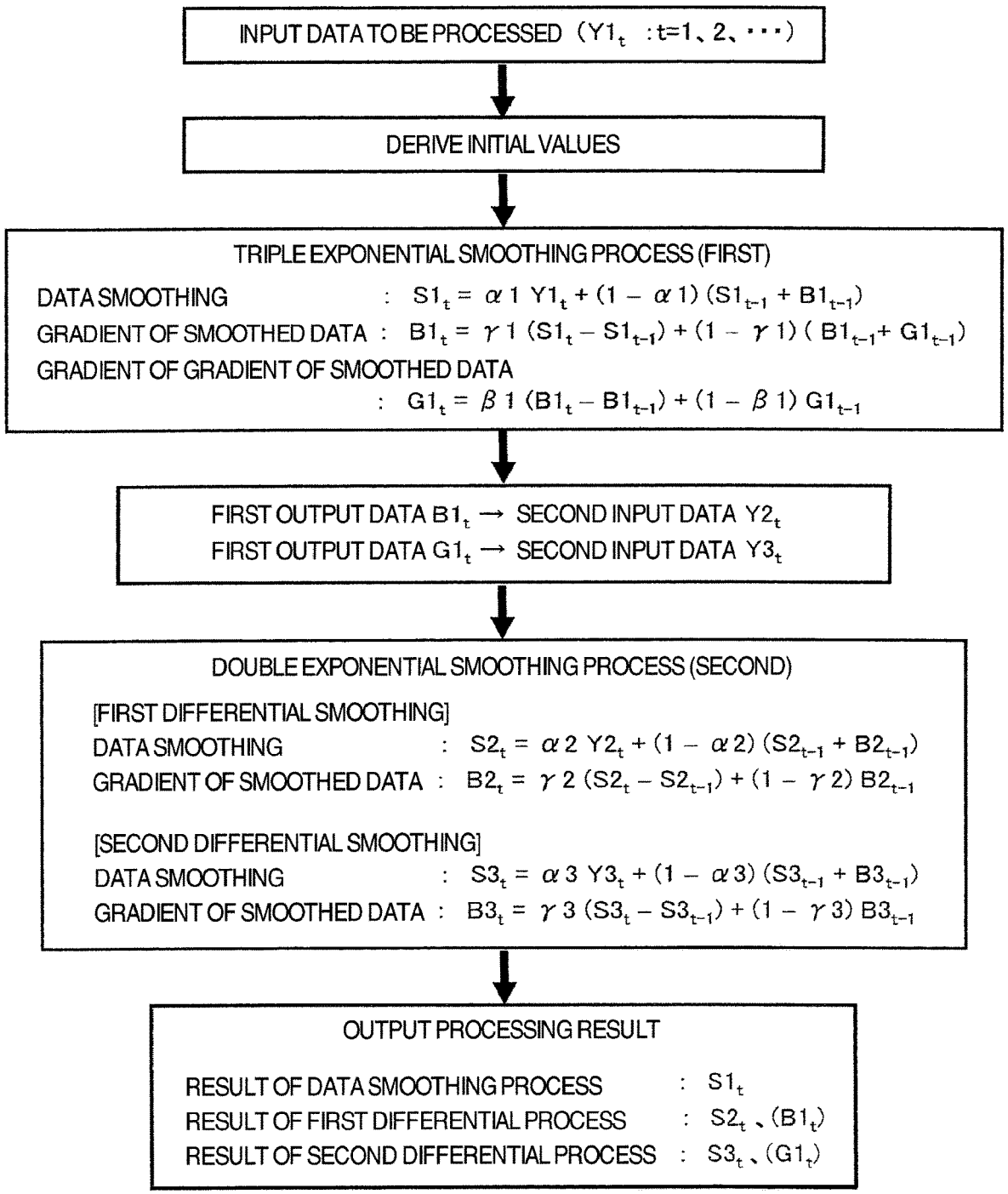
FIG. 12 is a diagram showing the flow of data processing according to an embodiment 3.

A data processing apparatus 1 according to a third embodiment of the present invention will be next described with reference to FIG. 12. In the present embodiment, Expressions (1) and (2) of the first-time double exponential smoothing process, in FIG. 2 showing the total flow of the method of the data smoothing process and the data differential process in the first embodiment the present invention, are replaced with the following Expressions (16) to (18) of a triple exponential smoothing process.

Predicted value of the data smoothing: $S1_t = \alpha 1 Y1_t + (1-\alpha 1)(S1_{t-1} + B1_{t-1})$  Expression (16)

Predicted value of the gradient of the smoothed data: $B1_t = \gamma 1(S1_t - S1_{t-1}) + (1-\gamma 1)(B1_{t-1} + G1_{t-1})$  Expression (17)

Predicted value of the gradient of the gradient of the smoothed data: $G1_t = \beta 1(B1_t - B1_{t-1}) + (1-\beta 1)G1_{t-1}$  Expression (18)

Next, a second-time double exponential smoothing process is performed twice, in which the predicted value $B1_t$ of the gradient of the smoothed data of the first output is set as a second input data $Y2_t$ and a predicted value $G1_t$ of the gradient of the gradient of the smoothed data in the first output is set as a second input data $Y3_t$. Two predicted values $S2_t$ and $S3_t$ of the data smoothing in the second output are thereby obtained. Next, result data on the data smoothing process $S1_t$, result data on a first differential data process $S2_t$, result data on second differential data process $S3_t$ are output collectively or sequentially.

Here, a smoothing parameter a1 of the predicted value of the data smoothing, a smoothing parameter γ1 of the predicted value of the gradient of the smoothed data, and a smoothing parameter β1 of the predicted value of the gradient of the gradient of the smoothed data in the first-time triple exponential smoothing, and smoothing parameters α2 and α3 of the predicted value of the data smoothing, and smoothing parameters γ2 and γ3 of the predicted value of the gradient of the smoothed data in the second twice-performed double exponential smoothing are set in advance. Note that, $0 < \alpha 1 < 1$, $0 < \gamma 1 < 1$, $0 < \beta 1 < 1$, $0 < \alpha 2 < 1$, $0 < \gamma 2 < 1$, $0 < \alpha 3 < 1$, and $0 < \gamma 3 < 1$.

The predicted value $B1_t$ of the gradient of the smoothed data in the first output and the predicted value $G1_t$ of the gradient of the gradient of the smoothed data in the first output may be used since the predicted value $B1_t$ is equivalent to the processing result of first differential and the predicted value $G1_t$ is equivalent to the result of the second differential process, but the data results thereof vary widely, and thus the data smoothing process is performed by performing the second-time double exponential smoothing process twice.

The smoothing parameters are fixed in the present embodiment, but as with the second embodiment of the present invention, an adaptive triple exponential smoothing process may be used in which the smoothing parameters are changed sequentially in accordance with the errors between the input data and the predicted value of the data smoothing.

In the present embodiment, there is a function and an advantage similar to those of the first embodiment. In addition, the data smoothing process, the first differential process, and the second differential process may be performed only by the first-time triple exponential smoothing process. In this case, there is an advantage that the data smoothing process, the first differential process, the second differential process can be simply performed in one process with a small data storage capacity. In addition, as can be easily inferred, by a method similar to that of the present embodiment, expanding Expressions (16) to (18) to an N-tuple exponential smoothing process, can perform the data smoothing process and differential processes from the first differential process to a (N−1)th differential process.

In the above-described embodiments, there have been described the cases where the data processing method and the data processing apparatus of the present invention are applied to the detection of the end point of etching process in the microwave plasma etching, performing the etching with high precision, and there is an advantage that a target device can be controlled with high precision also in etching devices or film-forming devices using other plasma production methods (inductively coupled method, parallel plate method, and the like), or processing apparatuses in other fields, or other devices, because using numerical data obtained from the device or the like as an input and applying the data processing apparatus and the data processing method of the present invention allows for monitoring the state of the device and detecting a changing point of the state with high precision.

In addition, there is an advantage that the data processing apparatus and the data processing method of the present invention can be applied to economic field or financial field such as supply and demand estimation, so as to analyze data with high precision.

In the present invention, by the sequential data processing, the data smoothing process and the data differential process can be performed with a high S/N ratio, a small data delay, and high reliability even in an initial period of starting the data processing. In addition, with the present invention, a data smoothing value, a first differential value, and a second differential value can be sequentially obtained in real time with a high S/N ratio, a short retardation time, or high reliability even in an initial period of starting the data processing. Furthermore, with the present invention, the target system can be controlled with high precision using the data smoothing value, the first differential value, and the second differential value.

Note that the present invention is not limited to the above-described embodiments, but includes various modifications. For example, the above-described embodiments have been described in detail such that the present invention is explained in an easily understandable manner. The present invention is not limited to those having all the described configurations. Part of the configuration of some embodiment may be replaced with the configuration of other embodiments, or the configuration of the other embodiment may be added to the configuration of some embodiment. Furthermore, other configurations may be added to, delete from, or replaced with part of the configurations of each embodiment.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A data processing method for processing data for controlling a plasma processing apparatus, using a double exponential smoothing method, the method comprising the steps of:
   obtaining, by a measuring device, data related to a plasma processing chamber in which a sample is subjected to a plasma process;
   receiving, by a data input/output device, the obtained data;
   storing the data in a storage;
   calculating, by a calculation processing apparatus, using a double exponential smoothing method in which the data is set as input data, a first predicted value that is a predicted value of smoothed data and a second predicted value that is a predicted value of a gradient of the smoothed data, as output data;
   calculating, by the calculation processing apparatus, using a double exponential smoothing method in which the second predicted value is set as input data, a third predicted value that is a predicted value of smoothed data and a fourth predicted value that is a predicted value of a gradient of the smoothed data, as output data;
   detecting an end point of the plasma process based on the first predicted value, the second predicted value or the third predicted value, and the fourth predicted value; and
   controlling the plasma processing apparatus based on the detected end point.

2. The data processing method according to claim 1, further comprising the step of:
   outputting, by the data input/output device, the first predicted value as a result of a data smoothing process, the second predicted value or the third predicted value as a result of a first differential process, and the fourth predicted value as a result of a second differential process, respectively.

3. The data processing method according to claim 1, further comprising the steps of:
   calculating, by the calculation processing apparatus, an approximate polynomial of an arbitrary number of pieces of data immediately following a start of data input; and
   calculating, by the calculation processing apparatus, using the approximate polynomial, a fifth predicted value that is a predicted value of smoothed data preceding the start of data input, and a sixth predicted value that is a predicted value of a gradient of smoothed data preceding the start of data input,
   wherein, in the step of calculating, using the double exponential smoothing method, the first predicted value that is the predicted value of smoothed data and the second predicted value that is the predicted value of the gradient of the smoothed data, the first predicted value and the second predicted value are calculated as the fifth predicted value and the sixth predicted value are set as initial values.

4. A data processing method for processing data for controlling a plasma processing apparatus, using a double exponential smoothing method, the method comprising the steps of:
   obtaining, by a measuring device, data related to a plasma processing chamber in which a sample is subjected to a plasma process;

receiving, by a data input/output device, the obtained data;

storing the data in a storage;

calculating, by a calculation processing apparatus, an approximate polynomial of an arbitrary number of pieces of data following a start of data input;

calculating, by the calculation processing apparatus, using the approximate polynomial, a first predicted value that is a predicted value of smoothed data preceding a start of data input, and a second predicted value that is a predicted value of a gradient of smoothed data preceding a start of data input;

subjecting the data to a double exponential smoothing process as the first predicted value and the second predicted value are set as initial values;

detecting an end point of the plasma process based on a result of the double exponential smoothing process; and controlling the plasma processing apparatus based on the detected end point.

5. The data processing method according to claim 4, wherein smoothing parameters are varied in accordance with an error between input data and smoothed data, wherein the data is processed while making a lower limit value of a variable range of the smoothing parameters greater than zero.

6. The data processing method according to claim 4, wherein when N denotes a natural number of 3 or more, the data is subjected to an N-tuple exponential smoothing process, and the N-tuple exponential smoothing process is a data process to successively perform a data smoothing process on the data and perform a first to (N−1)th smoothing processes to gradient of smoothed data.

7. The data processing method according to claim 6, wherein when the N is 3, a 3-tuple exponential smoothing process calculates a predicted value of the smoothed data, a predicted value of gradient of the smoothed data and a predicted value of gradient in gradient of the smoothed data.

8. A plasma processing method for subjecting a sample to a plasma process, the method comprising the steps of:

measuring light emission data in the plasma process of the sample;

processing, using a responsive double exponential smoothing method and smoothing parameters are varied in accordance with an error between the measured light emission data and a predicted value of smoothed light emission data, the light emission data while making a lower limit value of a variable range of the smoothing parameters greater than zero; and controlling the plasma process of the sample according to a detected plasma processing state of the sample or a change in the detected plasma processing state of the sample on the basis of at least one of a result of a data smoothing process calculated by the responsive double exponential smoothing method, a result of a first differential process calculated by the responsive double exponential smoothing method, and a result of a second differential process calculated by the responsive double exponential smoothing method.

\* \* \* \* \*